US012604773B2

(12) United States Patent
Yang et al.

(10) Patent No.: US 12,604,773 B2
(45) Date of Patent: Apr. 14, 2026

(54) ELECTRONIC DEVICE HAVING OPAQUE LAYER WITH OPENING FOR LIGHT TRANSMISSION

(71) Applicant: Innolux Corporation, Miaoli County (TW)

(72) Inventors: Chiu-Lien Yang, Miaoli County (TW); Jia-Yuan Chen, Miaoli County (TW); Tsung-Han Tsai, Miaoli County (TW); Kuan-Feng Lee, Miaoli County (TW); Chung-Wen Yen, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 600 days.

(21) Appl. No.: 18/082,595

(22) Filed: Dec. 16, 2022

(65) Prior Publication Data

US 2023/0230969 A1 Jul. 20, 2023

(30) Foreign Application Priority Data

Jan. 17, 2022 (CN) .......................... 202210051285.6

(51) Int. Cl.
*H01L 25/16* (2023.01)
*G06V 40/13* (2022.01)
*H01L 23/00* (2006.01)

(52) U.S. Cl.
CPC ........ *H01L 25/167* (2013.01); *G06V 40/1318* (2022.01); *H01L 24/05* (2013.01); *H01L 24/16* (2013.01); *H01L 2224/05567* (2013.01); *H01L 2224/05624* (2013.01); *H01L 2224/05647* (2013.01); *H01L 2224/05666* (2013.01); *H01L*

*2224/0568* (2013.01); *H01L 2224/16145* (2013.01); *H01L 2924/12041* (2013.01)

(58) Field of Classification Search
CPC ........ H01L 25/167; H01L 2924/12041; G06V 40/1318; G06V 10/147
See application file for complete search history.

(56) References Cited

U.S. PATENT DOCUMENTS

| | | | | |
|---|---|---|---|---|
| 10,295,701 | B2 * | 5/2019 | Wang | ........................ G01V 8/12 |
| 2010/0038523 | A1 * | 2/2010 | Venezia | ................ H10F 39/024 |
| | | | | 438/70 |
| 2016/0306042 | A1 * | 10/2016 | Schrank | .................. G01S 17/04 |
| 2017/0161543 | A1 * | 6/2017 | Smith | ................. G02F 1/13338 |
| 2018/0017741 | A1 * | 1/2018 | Ho | ......................... H10F 39/806 |
| 2019/0198585 | A1 * | 6/2019 | Chang | .................. H10H 29/142 |

(Continued)

FOREIGN PATENT DOCUMENTS

| | | | |
|---|---|---|---|
| EP | 3290950 A1 * | 3/2018 | ............. G01S 17/08 |
| TW | M614189 | 7/2021 | |

OTHER PUBLICATIONS

"Office Action of Taiwan Counterpart Application", issued on Jul. 27, 2023, p. 1-p. 5.

*Primary Examiner* — Mamadou L Diallo
(74) *Attorney, Agent, or Firm* — JCIPRNET

(57) ABSTRACT

The disclosure provides an electronic device, including: a circuit substrate, an inorganic light emitting unit, and an opaque layer. The circuit substrate includes an optical sensor. The inorganic light emitting unit is disposed on the circuit substrate and is configured to emit a light. The opaque layer is disposed on the circuit substrate, including a first opening through which a portion of the light is transmitted to the optical sensor.

11 Claims, 18 Drawing Sheets

1

(56) References Cited

U.S. PATENT DOCUMENTS

| | | | |
|---|---|---|---|
| 2019/0326339 A1* | 10/2019 | Dong | H04M 1/00 |
| 2020/0050829 A1* | 2/2020 | Akcasu | G06V 40/1365 |
| 2020/0088906 A1* | 3/2020 | Kwangkaew | G01V 8/12 |
| 2020/0103613 A1* | 4/2020 | Shen | H04N 23/54 |
| 2020/0401269 A1* | 12/2020 | Reynolds | G06V 40/1359 |
| 2021/0143294 A1* | 5/2021 | Saxod | H10F 71/00 |
| 2021/0376024 A1* | 12/2021 | Zheng | H10K 77/10 |
| 2022/0093523 A1* | 3/2022 | Shanmugam | H10F 77/93 |

* cited by examiner

ELECTRONIC DEVICE HAVING OPAQUE LAYER WITH OPENING FOR LIGHT TRANSMISSION

CROSS-REFERENCE TO RELATED APPLICATION

This application claims the priority benefit of China application serial no. 202210051285.6, filed on Jan. 17, 2022. The entirety of the above-mentioned patent application is hereby incorporated by reference herein and made a part of this specification.

BACKGROUND

Technical Field

The disclosure relates to an electronic device.

Description of Related Art

Existing electronic devices incorporate a sensing module therein to provide an identity recognition (e.g. fingerprint sensing) function. However, the current practice requires additional fabrication of the optical structures corresponding to the sensing modules, resulting in increased manufacturing processes.

SUMMARY

The disclosure provides an electronic device with a relatively simplified manufacturing process.

According to the embodiments of the disclosure, an electronic device includes a circuit substrate, an inorganic light emitting unit, and an opaque layer. The circuit substrate includes an optical sensor. The inorganic light emitting unit is disposed on the circuit substrate and configured to emit a light. The opaque layer is disposed on the circuit substrate, including a first opening through which a portion of the light is transmitted to the optical sensor.

In order to make the above-mentioned features and advantages of the disclosure more obvious and easy to understand, the following embodiments are given and described in detail with reference to the accompanying drawings as follows.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1:
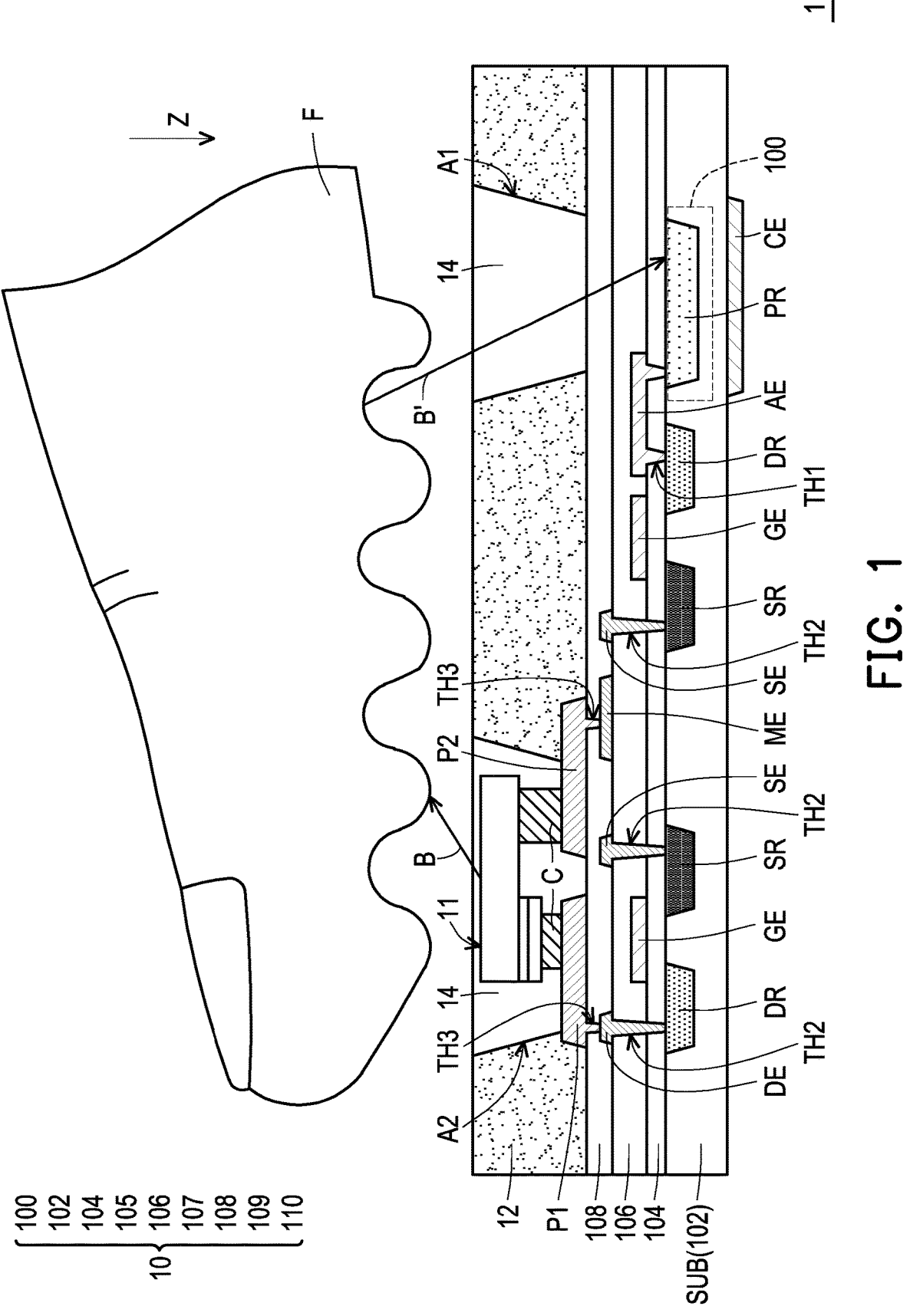
FIGS. 1-4, FIGS. 6-13, FIG. 15, FIG. 17, and FIG. 18 are partial cross-sectional schematic views of electronic devices according to some embodiments of the disclosure, respectively.

Reference will now be made in detail to the exemplary embodiments of the disclosure, examples of which are illustrated in the accompanying drawings. Whenever possible, the same reference numbers are used in the drawings and the description to refer to the same or like parts.

Certain terms are used throughout the specification and appended claims of the disclosure, to refer to specific components. As those skilled in the art will understand, electronic device manufacturers may refer to the same components by different names. The disclosure does not intend to distinguish between components that have the same function but different names. In the following specification and claims, terms such as "including", "containing", and "having" are open-ended terms, so should be interpreted as meaning "including but not limited to . . . .".

The directional terms mentioned in the disclosure, for example: "upper", "lower", "front", "rear", "left", "right" and like are only directions with reference to the accompanying drawings. Therefore, the directional terms used are for illustration, but not to limit the disclosure. In the drawings, each drawing shows the general features of the methods, structures and/or materials adopted in specific embodiments, but should not be construed as defining or limiting the scope or nature covered by the embodiments. For example, for clarity, the relative size, thickness, and position of each layer, region, and/or structure may be reduced or enlarged.

When a structure (or layer, component, substrate) is referred to as being located "on/above" another structure (or layer, component, substrate) in the disclosure, it may refer to the two structures being adjacent and directly connected, or it may mean that the two structures are adjacent but not directly connected. "Indirect connection" means that there is at least one intermediary structure (or intermediary layer, intermediary component, intermediary substrate, intermediary space) between the two structures, in which the lower surface of a structure is adjacent to or directly connected to the upper surface of the intermediary structure, and the upper surface of the other structure is adjacent to or directly connected to the lower surface of the intermediary structure. The intermediary structure may be a single-layer or multi-layer physical structure or non-physical structure, with no limit. In the disclosure, when a structure is disposed "on" another structure, it may mean that the structure is "directly" on another structure, or that the structure is "indirectly" on another structure, with at least one structure sandwiched between the two structures.

The terms "about", "equal to", "equivalent", "same", "substantially" or "approximately" are generally interpreted as being within 20% of a given value or range, or interpreted as being within 10%, 5%, 3%, 2%, 1%, or 0.5% of a given value or range.

Ordinal numbers such as "first", "second", and the like recited in the specification and claims are used to qualify components, and do not imply or represent that the component (or components) is/are preceded with any ordinal numbers, nor do they represent the order of one component with respect to another component, or the order of the manufacturing method. The ordinal numbers are used only to clearly distinguish a component with a certain name from another component with the same name. Different terms may be used in the claims and the specification, whereby a first component in the specification may be a second component in a claim.

The "electrical connection" or "coupling" described in the disclosure may refer to direct connection or indirect connection. In the case of direct connection, the endpoints of the components on the two circuits are directly connected or connected to each other by a conductor segment; in the case of indirect connection, the endpoints of the components on the two circuits may be provided therebetween with switch, diode, capacitor, inductor, resistor, other suitable components, or a combination thereof, but the disclosure is not limited thereto.

In the disclosure, thickness, length, and width can be measured by an optical microscope, and the thickness or width can be measured by a cross-sectional image in an electron microscope, but the disclosure is not limited thereto. Moreover, any two values or directions used for comparison may have a certain amount of error. In addition, the terms "equal to," "equivalent," "same," "substantially," or "approximately" as used throughout the disclosure generally mean that they fall within 10% of a given value or range. Furthermore, the terms "a given range is from a first value to a second value", and "a given range is within a range from the first value to the second value" indicate that the given range includes the first value, the second value, and other values in between. If the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees.

It is important to note that the following embodiments may, without departing from the spirit of the disclosure, replace, reorganize, and mix features of several different embodiments to complete other embodiments. The features between various embodiments can be mixed and matched arbitrarily as long as they do not violate the spirit of the invention or conflict with each other.

Unless otherwise defined, all terms (including technical and scientific terms) used herein have the same meaning as commonly understood by persons having ordinary skill in the art to which the disclosure belongs. It is understood that these terms, such as those defined in commonly used dictionaries, should be interpreted as having meanings consistent with the relevant art and the background or context of the disclosure, and should not be interpreted in an idealized or overly formal way, unless otherwise defined in the embodiments of the disclosure.

The electronic device disclosed in the specification may include a display device, a backlight device, an antenna device, a sensing device or a tiled device, but is not limited thereto. The electronic device may be a bendable or flexible electronic device. The display device may be a non-self-luminous display device or a self-luminous display device. The antenna device may be a liquid crystal antenna device or a non-liquid crystal antenna device, and the sensing device may be a sensing device for sensing capacitance, light, heat or ultrasonic waves, but is not limited thereto. In the disclosure, the electronic components may include passive components and active components, such as capacitors, resistors, inductors, diodes, transistors, and the like. The diodes may include light emitting diodes or photodiodes. The light emitting diodes may include, for example, organic light emitting diodes (OLED), sub-millimeter light emitting diodes (mini LED), micro light emitting diodes (micro LED), or quantum dot light emitting diodes (quantum dot LED), but is not limited thereto. The tiled device may be, for example, a display tiled device or an antenna tiled device, but is not limited thereto. It should be noted that the electronic device may be any arrangement and combination of the foregoing, but not limited to thereto. The display device is used as the electronic device or the tiled device to illustrate the disclosure hereinafter, but the disclosure is not limited thereto.

It should be noted that the technical solutions provided by the different embodiments hereinafter can be replaced, combined, or mixed, so as to constitute another embodiment without violating the spirit of the disclosure.

FIGS. 1-4, FIGS. 6-13, FIG. 15, FIG. 17, and FIG. 18 are partial cross-sectional schematic views of electronic devices according to some embodiments of the disclosure, respectively. FIG. 5 is a partial top schematic view of the electronic device of FIG. 4. FIG. 14 is a partial top schematic view of the electronic device in FIG. 13; for a section line I-I' in FIG. 14, refer to a region RI in FIG. 13. FIG. 16 is a partial top schematic view of the electronic device in FIG. 15; for a section line II-II' in FIG. 16, refer to a region RII in FIG. 15.

Referring to FIG. 1, an electronic device 1 may include a circuit substrate 10, an inorganic light emitting unit 11, and an opaque layer 12. The circuit substrate 10 includes an optical sensor 100. The inorganic light emitting unit 11 is disposed on the circuit substrate 10 and configured to emit a light B. The opaque layer 12 is disposed on the circuit substrate 10 and includes a first opening A1. A portion of the light B (e.g. a light B') is transmitted to the optical sensor 100 through the first opening A1. In the disclosure, the inorganic light emitting unit 11 can be replaced with any one or a combination of the aforementioned electronic components.

In detail, the circuit substrate 10 may include a complementary metal oxide semiconductor (CMOS) backplane in which semiconductor components are formed by doping on a semiconductor substrate, or a TFT backplane on which thin film transistors (TFT) are fabricated by a thin film process, but the disclosure is not limited thereto.

Taking a CMOS backplane as an example, the circuit substrate 10 may include a semiconductor substrate 102, and the optical sensor 100 may be embedded in the semiconductor substrate 102. The material of the semiconductor substrate 102 may include semiconductor materials such as monocrystalline crystal silicon, polycrystalline silicon, silicon carbide, gallium nitride or germanium. Embedding the optical sensor 100 in the semiconductor substrate 102 refers to forming a photosensitive semiconductor component that may sense light in the semiconductor substrate 102 through an ion implantation process.

In some embodiments, as shown in FIG. 1, the semiconductor substrate 102 may include an N-type silicon substrate SUB. In the N-type silicon substrate SUB, a P-type doped region PR may be formed through an ion implantation process, and the optical sensor 100 may include a photodiode composed of the P-type doped region PR and a portion of the N-type silicon substrate SUB, but the types of the optical sensor 100 are not limited thereto. In other embodiments, the optical sensor 100 may be a photo-transistor, a metal-semiconductor-metal photodetector (MSM photo-detector), or a camera, but the disclosure is not limited thereto.

In addition to the P-type doped region PR, the N-type silicon substrate SUB may also be formed with a source region SR and a drain region DR through an ion implantation process. FIG. 1 schematically illustrates one P-type doped region PR, two source regions SR and two drain regions DR, but the respective numbers of the P-type doped regions PR, the source regions SR and the drain regions DR in the circuit substrate 10 or the relative arrangement relationship of the above components may be changed according to requirements, and are not limited to those shown in FIG. 1.

According to different requirements, the circuit substrate 10 may include other film layers. For example, the circuit substrate 10 may further include a dielectric layer 104, a conductive layer 105, a dielectric layer 106, a conductive layer 107, a dielectric layer 108, a conductive layer 109, and a conductive layer 110, but the disclosure is not limited thereto.

The dielectric layer 104 is disposed on the semiconductor substrate 102 and covers the P-type doped region PR, the source regions SR, and the drain regions DR. The material of the dielectric layer 104 may include inorganic materials, such as, but not limited to, silicon oxide ($SiO_x$) or silicon nitride ($SiN_x$).

The conductive layer 105 is disposed on the dielectric layer 104. The material of the conductive layer 105 may include metal or metal stacks such as aluminum, copper, molybdenum, titanium, or a combination thereof, but is not limited thereto. The conductive layer 105 may be a patterned conductive layer, and the conductive layer 105 may include a gate electrode GE, an anode AE, and other circuits (not shown), but is not limited thereto. The anode AE may electrically connect the P-type doped region PR and the adjacent drain region DR through the through hole TH1 penetrating the dielectric layer 104.

The dielectric layer 106 is disposed on the dielectric layer 104 and covers the conductive layer 105. The material of the dielectric layer 106 may include inorganic materials, such as, but not limited to, silicon oxide or silicon nitride.

The conductive layer 107 is disposed on the dielectric layer 106. The material of the conductive layer 107 may include metal or metal stacks, such as, but not limited, aluminum, copper, molybdenum, titanium, or a combination thereof. The conductive layer 107 may be a patterned conductive layer, and the conductive layer 107 may include a source electrode SE, a drain electrode DE, a common electrode ME, and other circuits (not shown), but the disclosure is not limited thereto. The source electrode SE may be electrically connected to the corresponding source region SR through a through hole TH2 penetrating the dielectric layer 104 and the dielectric layer 106. The drain electrode DE may be electrically connected to the corresponding drain region DR through the corresponding through hole TH2.

The dielectric layer 108 is disposed on the dielectric layer 106 and covers the conductive layer 107. The material of the dielectric layer 108 may include inorganic materials, such as, but not limited to, silicon oxide or silicon nitride.

The conductive layer 109 is disposed on the dielectric layer 108. The material of the conductive layer 109 may include metal or metal stacks, such as, but not limited to, aluminum, copper, molybdenum, titanium, or a combination thereof. The conductive layer 109 may be a patterned conductive layer, and the conductive layer 109 may include a pad P1, a pad P2, and other circuits (not shown), but the disclosure is not limited thereto. The pad P1 may be electrically connected to the corresponding drain electrodes DE through a through hole TH3 penetrating the dielectric layer 108. The pad P2 may be electrically connected to the corresponding common electrode ME through the corresponding through hole TH3.

The conductive layer 110 is disposed on the surface of the semiconductor substrate 102 away from the P-type doped region PR. The material of the conductive layer 110 may include metal or metal stacks, such as, but not limited to, aluminum, copper, molybdenum, titanium, or a combination thereof. The conductive layer 110 may be a patterned conductive layer, and the conductive layer 110 may include a cathode CE. The cathode CE is located, for example, below the P-type doped region PR.

The inorganic light emitting unit 11 may be bonded to the pad P1 and the pad P2 through a conductive member C, for example. The conductive member C may include solder, anisotropic conductive film (ACF), anisotropic conductive paste (ACP), or other conductive bonding members. The inorganic light emitting unit 11 may include a sub-millimeter light emitting diode (mini LED), a micro light emitting diode (micro LED), or a quantum dot light emitting diode (quantum dot LED), but is not limited thereto. In some embodiments, the inorganic light emitting unit 11 may be a light emitting diode chip, but not limited thereto. In other embodiments, the inorganic light emitting unit 11 may be a light emitting diode package.

The opaque layer 12 is disposed on the dielectric layer 108 and may partially cover the pad P1 and the pad P2, but the disclosure is not limited thereto. The transmittance of the opaque layer 12 to the light B is, for example, less than 50%. For example, the light source and the illuminometer may be disposed on opposite sides of the electronic device to measure the transmittance of the opaque layer 12. Transmittance is defined as the light intensity received by the illuminometer divided by the light intensity output by the light source.

In some embodiments, the material of the opaque layer 12 may include black resin, white resin, or gray resin, but the disclosure is not limited thereto. In other embodiments, a metal layer in the circuit substrate 10 may serve as the opaque layer 12. The sidewall of the opaque layer 12 may be disposed with metal materials to improve reflectivity.

The first opening A1 of the opaque layer 12 is disposed corresponding to the optical sensor 100. In some embodiments, the first opening A1 at least partially overlaps with the optical sensor 100 in a top view direction (e.g. direction Z) of the electronic device 1, but the disclosure is not limited thereto. In other embodiments, the first opening A1 may not need to overlap with the optical sensor 100 in a top view direction (e.g. the direction Z) of the electronic device 1. The first opening A1 allows part of the light B (e.g. the light B' reflected by the object to be measured) to be transmitted to the optical sensor 100, and the first opening A1 may also filter stray light to reduce the probability of the optical sensor 100 receiving stray light.

In some embodiments, the opaque layer 12 may further include a second opening A2. The second opening A2 exposes the pad P1 and the pad P2, and the inorganic light emitting unit 11 may be disposed in the second opening A2.

According to different requirements, the electronic device 1 may also include other components or film layers. For example, the electronic device 1 may further include a light-transmitting layer 14. The light-transmitting layer 14 fills the first opening A1 and the second opening A2. The material of the light-transmitting layer 14 may include organic materials, inorganic materials, or bonding materials, but is not limited thereto. The organic material may include polymethyl methacrylate (PMMA), epoxy, acrylic-based resin, silicone, polyimide polymer, or a combination thereof, but the disclosure is not limited thereto. The inorganic material may include, but not limited to, silicon oxide or silicon nitride. The bonding material may include, but not limited to, optical clear adhesive (OCA) or optical clear resin (OCR). The light-transmitting layer 14 may be formed by stacking multiple layers of materials, and the light-transmitting layer 14 may be a color resist material through which light of a specific wavelength band may pass.

By incorporating the optical sensor 100 in the circuit substrate 10 and forming the first opening A1 for allowing light to pass through and the second opening A2 for accommodating the inorganic light emitting unit 11 in the opaque layer 12, there is no need to additionally fabricate an optical structure (such as a light-shielding structure or a light-collimating structure) corresponding to the sensing module (the optical sensor 100), and thus a relatively simplified manufacturing process can be achieved.

In some embodiments, the electronic device 1 may provide an identity recognition function, such as a fingerprint sensing function; that is, the optical sensor 100 is configured to sense the fingerprint F, but it is not limited thereto. In other embodiments, the optical sensor 100 may be configured to sense palm prints or other biometric features.

Figure 2:
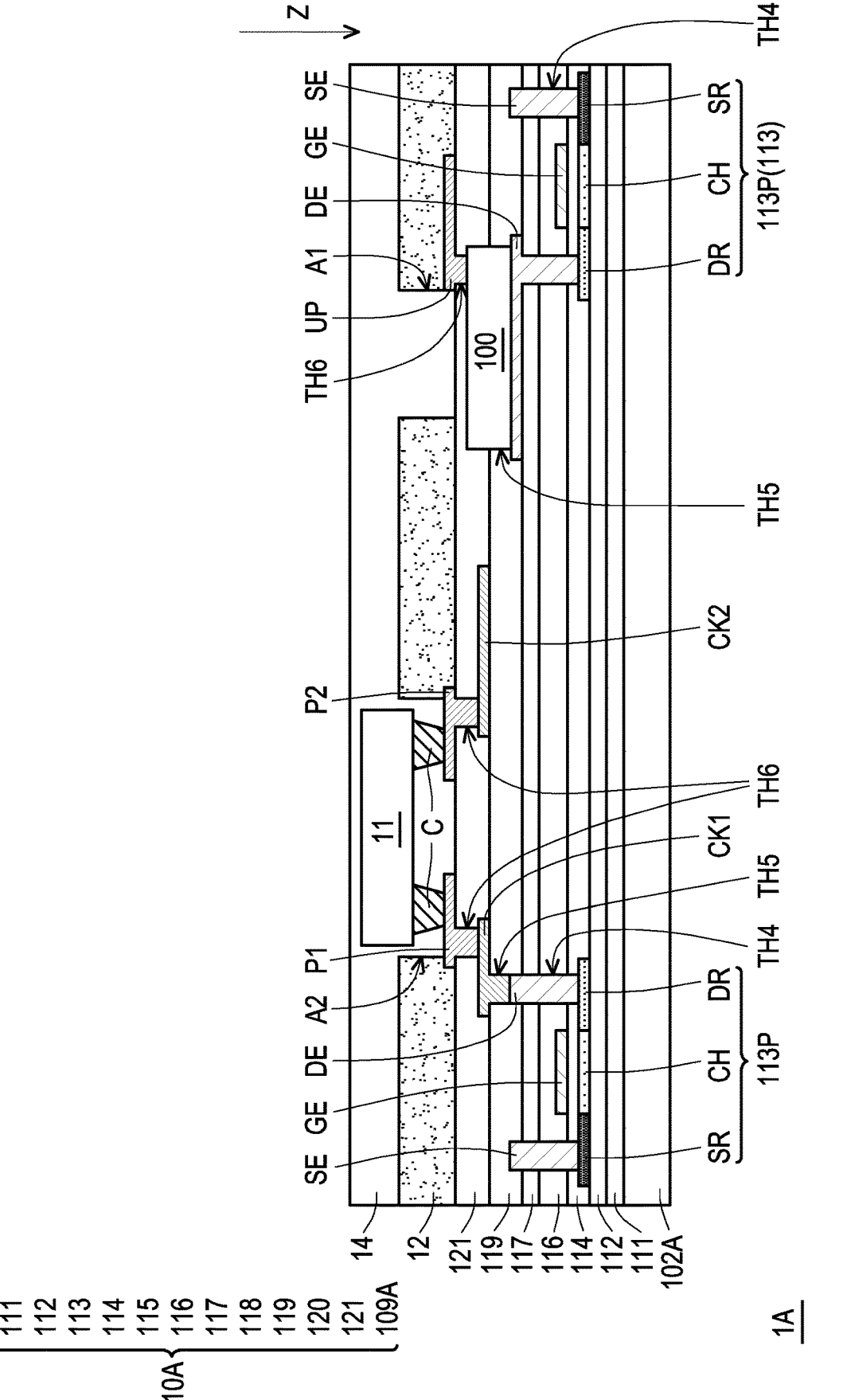

Referring to FIG. 2, the main differences between an electronic device 1A and the electronic device 1 of FIG. 1 are as follows. In the electronic device 1A, a circuit substrate 10A is, for example, a TFT backplane, and the circuit substrate 10A further includes a substrate 102A. The optical sensor 100 is disposed on the substrate 102A.

In detail, the substrate 102A may include a flexible substrate or a rigid substrate. The material of the substrate 102A may include, but not limited to, glass, plastic, ceramic, quartz, sapphire, or a combination of the above materials. The optical sensor 100 may be formed on the substrate 102A through a thin film process.

In some embodiments, the circuit substrate 10A may further include a buffer layer 111, a buffer layer 112, a semiconductor layer 113, a dielectric layer 114, a conductive layer 115, a dielectric layer 116, a dielectric layer 117, a conductive layer 118, a dielectric layer 119, a conductive layer 120, a dielectric layer 121, and a conductive layer 109A, but the disclosure is not limited thereto. According to different requirements, one or more components or layers may be added in or subtracted from the circuit substrate 10A.

The buffer layer 111 and the buffer layer 112 are sequentially disposed on the substrate 102A. For example, the materials of the buffer layer 111 and the buffer layer 112 may include inorganic materials, such as silicon oxide, silicon nitride, silicon oxynitride or aluminum oxide, or include organic materials, such as perfluoroalkoxy alkane (PFA), but the disclosure is not limited thereto.

The semiconductor layer 113 is disposed on the buffer layer 112. For example, the material of the semiconductor layer 113 includes an oxide semiconductor material, such as Indium gallium zinc oxide (IGZO), but is not limited thereto. In other embodiments, the material of the semiconductor layer 113 may include amorphous silicon, polysilicon, or metal oxide. The semiconductor layer 113 is, for example, a patterned semiconductor layer and may include a plurality of semiconductor patterns 113P. The semiconductor pattern 113P may include a channel region CH, the source region SR, and the drain region DR, wherein the channel region CH is located between the source region SR and the drain region DR.

The dielectric layer 114 is disposed on the dielectric layer 112 and covers the semiconductor layer 113. For example, the material of the dielectric layer 114 may include inorganic materials, such as, but not limited to, silicon oxide, silicon nitride, silicon oxynitride, or aluminum oxide, or include organic materials, such as perfluoroalkoxy alkane (PFA).

The conductive layer 115 is disposed on the dielectric layer 114. The material of the conductive layer 115 may include metal or metal stacks, such as, but not limited to, aluminum, copper, molybdenum, titanium, or a combination thereof. The conductive layer 115 may be a patterned conductive layer, and the conductive layer 115 may include the gate electrode GE and other circuits (not shown), but is not limited thereto. The gate electrode GE is disposed on the channel region CH, and the gate electrode GE overlaps the channel region CH in the direction Z.

The dielectric layer 116 and the dielectric layer 117 are sequentially disposed on the dielectric layer 112 and cover the conductive layer 115. The material of the dielectric layer 116 may include inorganic materials, such as silicon oxide, silicon nitride, silicon oxynitride or aluminum oxide, or include organic materials, such as perfluoroalkoxy alkane (PFA), but the disclosure is not limited thereto.

The conductive layer 118 is disposed on the dielectric layer 117. The material of the conductive layer 118 may include metal or a metal stacks, such as, but not limited to, aluminum, copper, molybdenum, titanium, or a combination thereof. The conductive layer 118 may be a patterned conductive layer, and the conductive layer 118 may include the source electrode SE, the drain electrode DE and other circuits (not shown), but the disclosure is not limited thereto. The source electrode SE may be electrically connected to the corresponding source region SR through a through hole TH4 penetrating the dielectric layer 117, the dielectric layer 116, and the dielectric layer 114. The drain electrode DE may be electrically connected to the corresponding drain region DR through the corresponding through hole TH4.

The dielectric layer 119 is disposed on the dielectric layer 117 and covers the conductive layer 118. The material of the dielectric layer 119 may include inorganic materials, such as silicon oxide, silicon nitride, silicon oxynitride or aluminum oxide, or include organic materials, such as perfluoroalkoxy alkane (PFA), but the disclosure is not limited thereto.

The conductive layer 120 is disposed on the dielectric layer 119. The material of the conductive layer 120 may include metal or metal stacks, such as, but not limited to, aluminum, copper, molybdenum, titanium, or a combination thereof. The conductive layer 120 may be a patterned conductive layer, and the conductive layer 120 may include a circuit CK1, a circuit CK2, and other circuits (not shown), but the disclosure is not limited thereto. The circuit CK1 may be electrically connected to the corresponding drain electrode DE through a through hole TH5 penetrating the dielectric layer 119. The optical sensors 100 are disposed on the corresponding drain electrodes DE and is located in the through hole TH5 penetrating the dielectric layer 119.

The dielectric layer 121 is disposed on the dielectric layer 119 and covers the conductive layer 120 and the optical sensor 100. The material of the dielectric layer 121 may include inorganic materials such as silicon oxide, silicon nitride, silicon oxynitride or aluminum oxide, or include organic materials such as perfluoroalkoxy alkane (PFA), but the disclosure is not limited thereto.

The conductive layer 109A is disposed on the dielectric layer 121. The material of the conductive layer 109A may include metal or metal stacks, such as, but not limited to, aluminum, copper, molybdenum, titanium, or a combination thereof. The conductive layer 109A may be a patterned conductive layer, and the conductive layer 109A may include the pad P1, the pad P2, an electrode UP, and other circuits (not shown), but the disclosure is not limited thereto. The pad P1 may be electrically connected to the corresponding drain electrode DE through a through hole TH6 penetrating the dielectric layer 121. The pad P2 may be electrically connected to the circuit CK2 through the corresponding through hole TH6. The electrode UP may be electrically connected to the optical sensor 100 through the corresponding through hole TH6.

The opaque layer 12 is disposed on the dielectric layer 121 and may cover the electrode UP and may partially cover the pad P1 and the pad P2, but the disclosure is not limited thereto. The light-transmitting layer 14 is disposed on the opaque layer 12 and fills the first opening A1 and the second opening A2.

Figure 3:
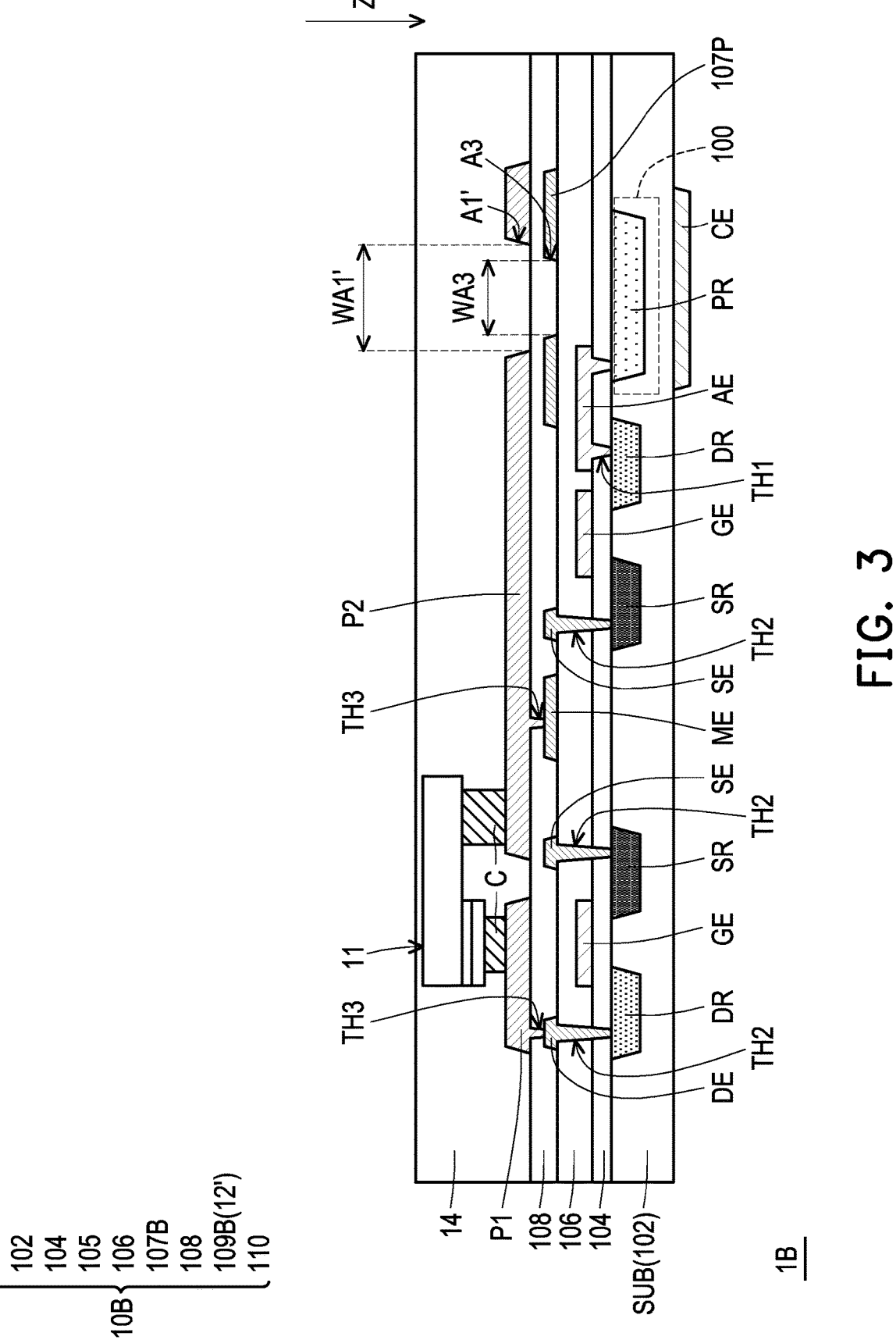

Referring to FIG. 3, the main differences between an electronic device 1B and the electronic device 1 of FIG. 1 are described as follows. In the electronic device 1B, an opaque layer 12' includes metal pads (e.g. the pad P1 and the pad P2), and the inorganic light emitting unit 11 is bonded onto the metal pads (e.g. the pad P1 and the pad P2). The pad P2 in a conductive layer 109B may extend above the optical sensor 100, and the pad P2 may include a first opening A1'. By using the conductive layer 109B in a circuit substrate 10B serving as the opaque layer 12', the opaque layer 12 of FIG. 1 may be omitted.

In some embodiments, in addition to the source electrode SE, the drain electrode DE, and the common electrode ME, a conductive layer 107B in the circuit substrate 10B may further include a pattern 107P disposed above the optical sensor 100, and the pattern 107P may include a third opening A3. The third opening A3 may overlap or partially overlap the first opening A1' in the direction Z.

The design of filtering stray light using the openings in the multi-layer metal layers (e.g. the conductive layer 107B and the conductive layer 109B) disposed above the optical sensor 100 helps to reduce the chance of the optical sensor 100 receiving stray light. In some embodiments, the width of the metal layer opening closer to the optical sensor 100 may be smaller than the width of the metal layer opening farther from the optical sensor 100. In other words, a bottom width WA3 of the third opening A3 is made smaller than a bottom width WA1' of the first opening A1', so as to improve the effect of filtering stray light, but the disclosure is not limited thereto.

It should be understood that the electronic device of any embodiment of the disclosure may be designed to filter stray light by using the design of opening in the multi-layer metal layers (such as the conductive layer 107B and the conductive layer 109B) disposed above the optical sensor 100, which will not be repeated below.

Figure 4:
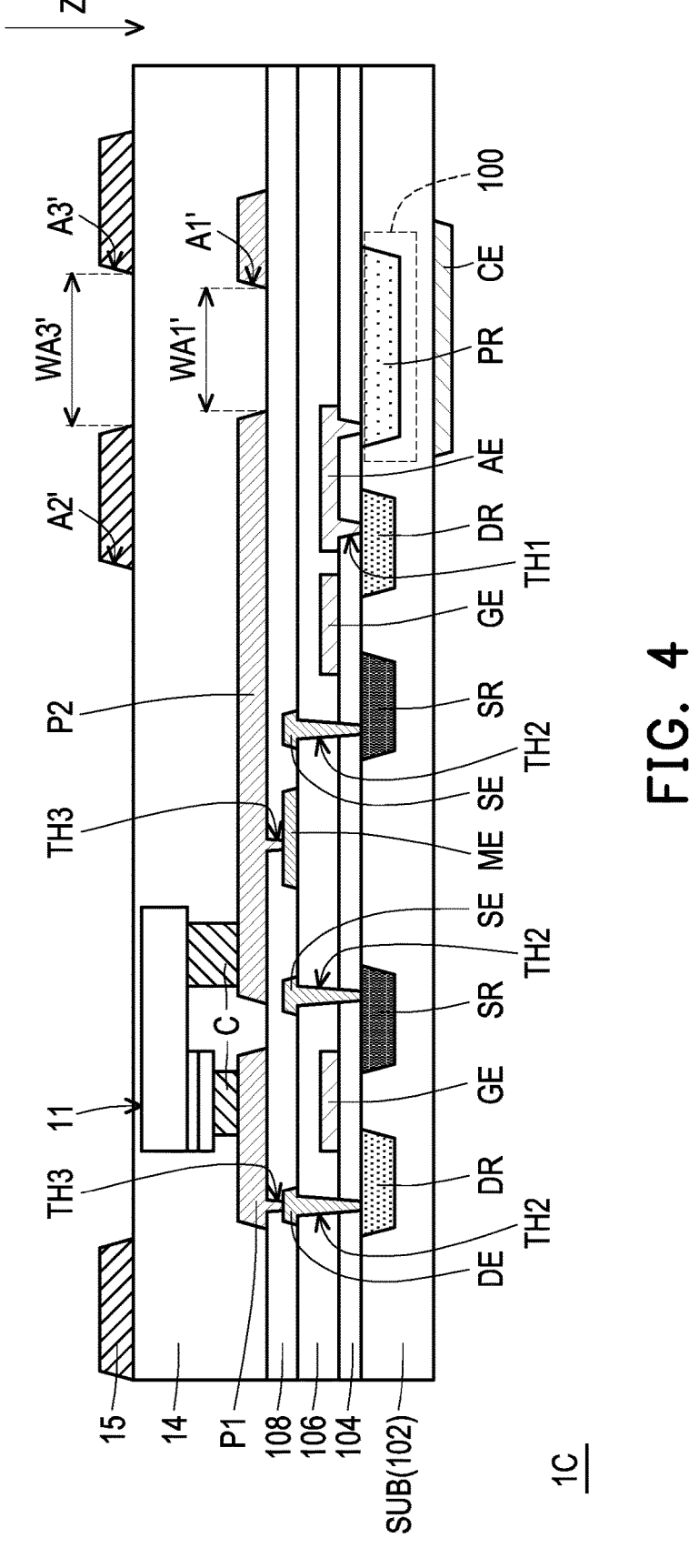
Figure 5:
FIG. 5 is a partial top schematic view of the electronic device of FIG. 4.

Referring to FIG. 4 and FIG. 5, the main differences between an electronic device 1C and the electronic device 1B of FIG. 3 are described as follows. The electronic device 1C further includes a metal mesh layer 15 to provide a touch function, and the metal mesh layer 15 is disposed on the inorganic light emitting unit 11. For example, the metal mesh layer 15 may be disposed on the light-transmitting layer 14, but not limited thereto. The metal mesh layer 15 may include a third opening A3', and the third opening A3' overlaps with the first opening A1', such that the light reflected by the object to be measured may be transmitted to the optical sensor 100. The overlapping of the third opening A3' and the first opening A1' generally means that the third opening A3' and the first opening A1' overlap each other in a top view direction (the direction Z) of the electronic device 1C. In some embodiments, the bottom width WA1' of the first opening A1' may be made smaller than a bottom width WA3' of the third opening A3' to improve the effect of filtering stray light, but the disclosure is not limited thereto.

In addition to the third opening A3' corresponding to the optical sensor 100, the metal mesh layer 15 may further include a second opening A2' overlapping the inorganic light emitting unit 11 in the direction Z, but the disclosure is not limited thereto. In other embodiments, although not shown, the size of the third opening A3' may be enlarged such that the third opening A3' overlaps one optical sensor 100 and one inorganic light emitting unit 11 in the direction Z.

With the structure in which the metal mesh layer 15 is provided, a circuit substrate 10C may not need to include the pattern 107P of FIG. 3; that is, in the circuit substrate 10C, the conductive layer 107B of FIG. 3 is replaced with the conductive layer 107, but the disclosure is not limited thereto. In other embodiments not shown, the circuit substrate 10C may include the pattern 107P of FIG. 3; that is, the conductive layer 107 is replaced with the conductive layer 107B of FIG. 3.

It should be understood that the electronic device of any embodiment of the disclosure may be designed to filter stray light by using the design of opening in the multi-layer metal layers (e.g. the conductive layer 107B, the conductive layer 109B and/or the conductive layer 107B of FIG. 3) disposed above the optical sensor 100, which will not be repeated below.

Figure 6:
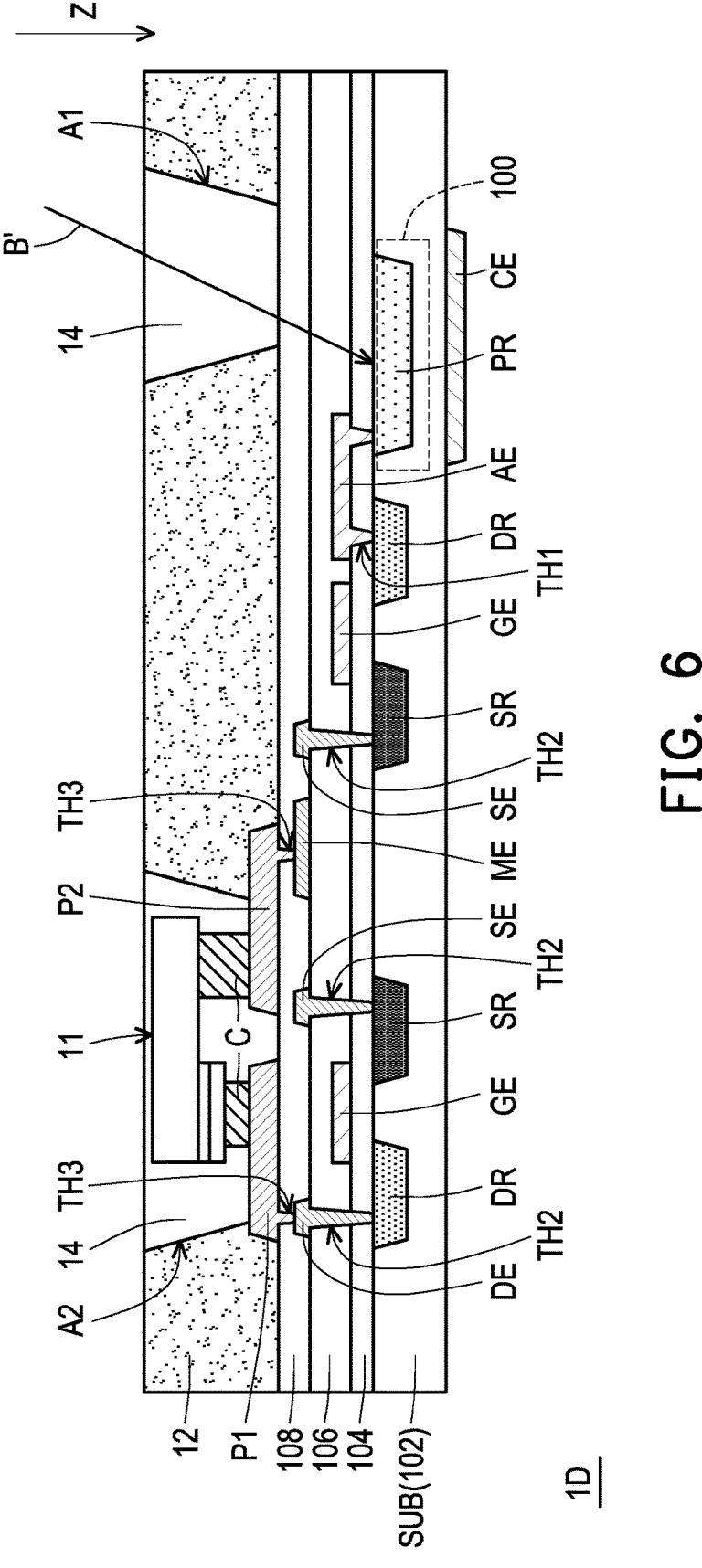

Referring to FIG. 6, the main difference between an electronic device 1D and the electronic device 1 of FIG. 1 is described as follows. In the electronic device 1D, the optical sensor 100 partially overlaps the first opening A1 in the direction Z, such that the light B' obliquely incident on the optical sensor 100 may be received by the optical sensor 100.

Figure 7:
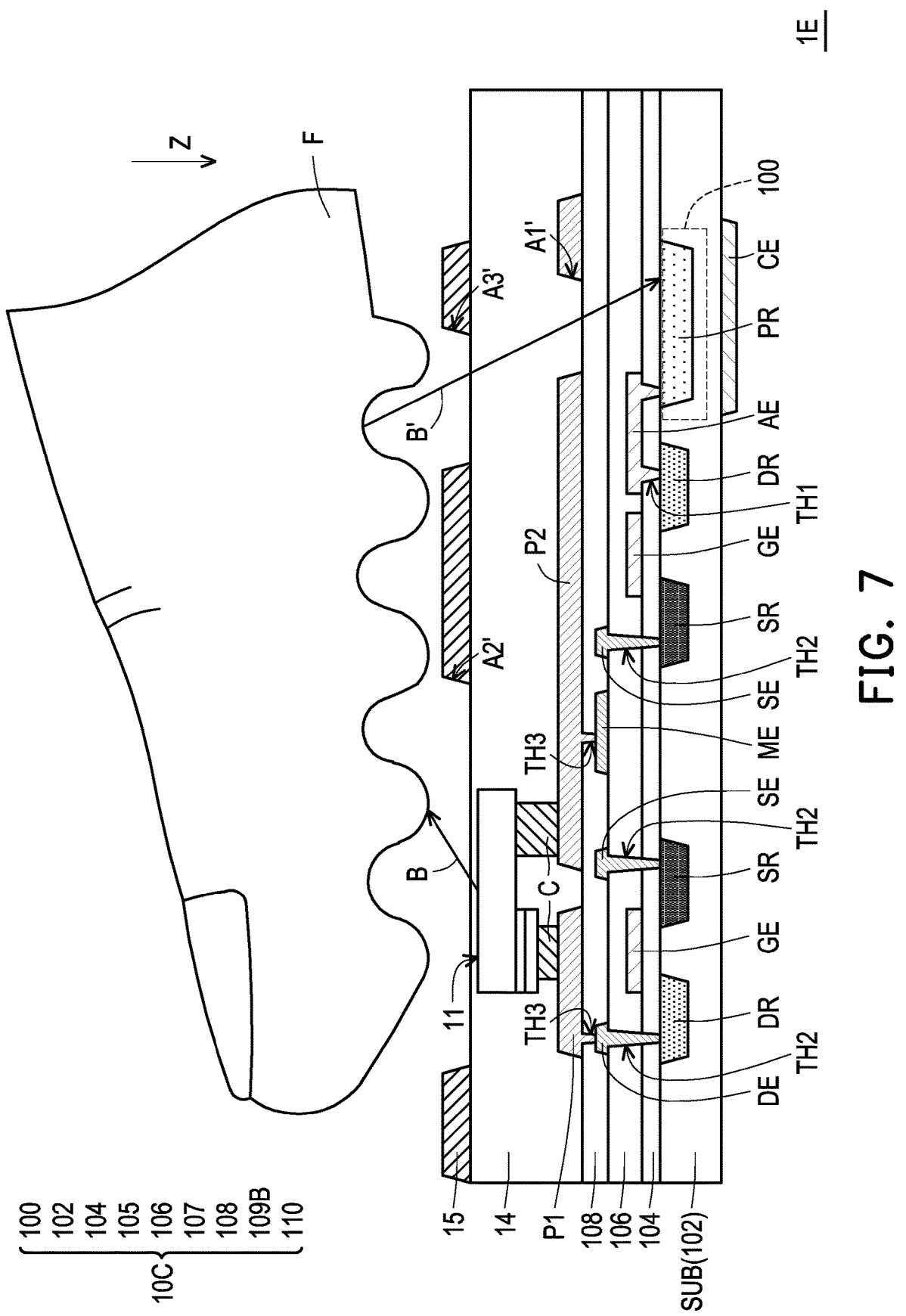

Referring to FIG. 7, the main difference between an electronic device 1E and the electronic device 1C of FIG. 4 is described as follows. In the electronic device 1E, the third opening A3' partially overlaps the first opening A1' in the direction Z, such that the light B' obliquely incident on the optical sensor 100 may be received by the optical sensor 100.

Figure 8:
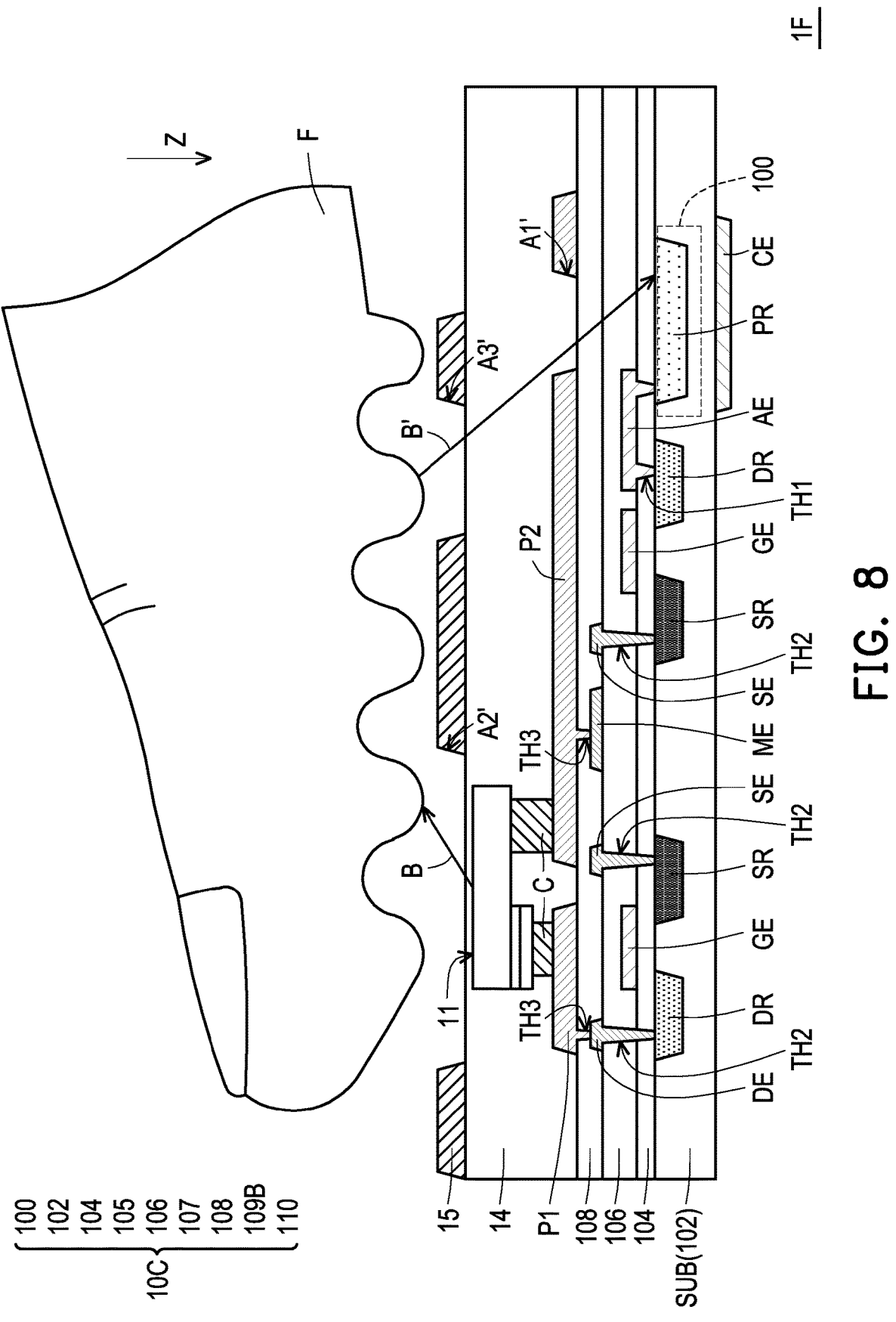

Referring to FIG. 8, the main difference between an electronic device 1F and the electronic device 1C of FIG. 4 is described as follows. In the electronic device 1F, the third opening A3' and the first opening A1' do not overlap in the direction Z, such that the optical sensor 100 may receive the more oblique light B'.

It should be understood that, in the electronic device of any embodiment of the disclosure, the relative arrangement relationship between the light-transmitting openings of the metal layer and/or the opaque layer and the optical sensor may be adjusted according to design requirements (such as the light-receiving angle), which will not be repeated below.

Figure 9:
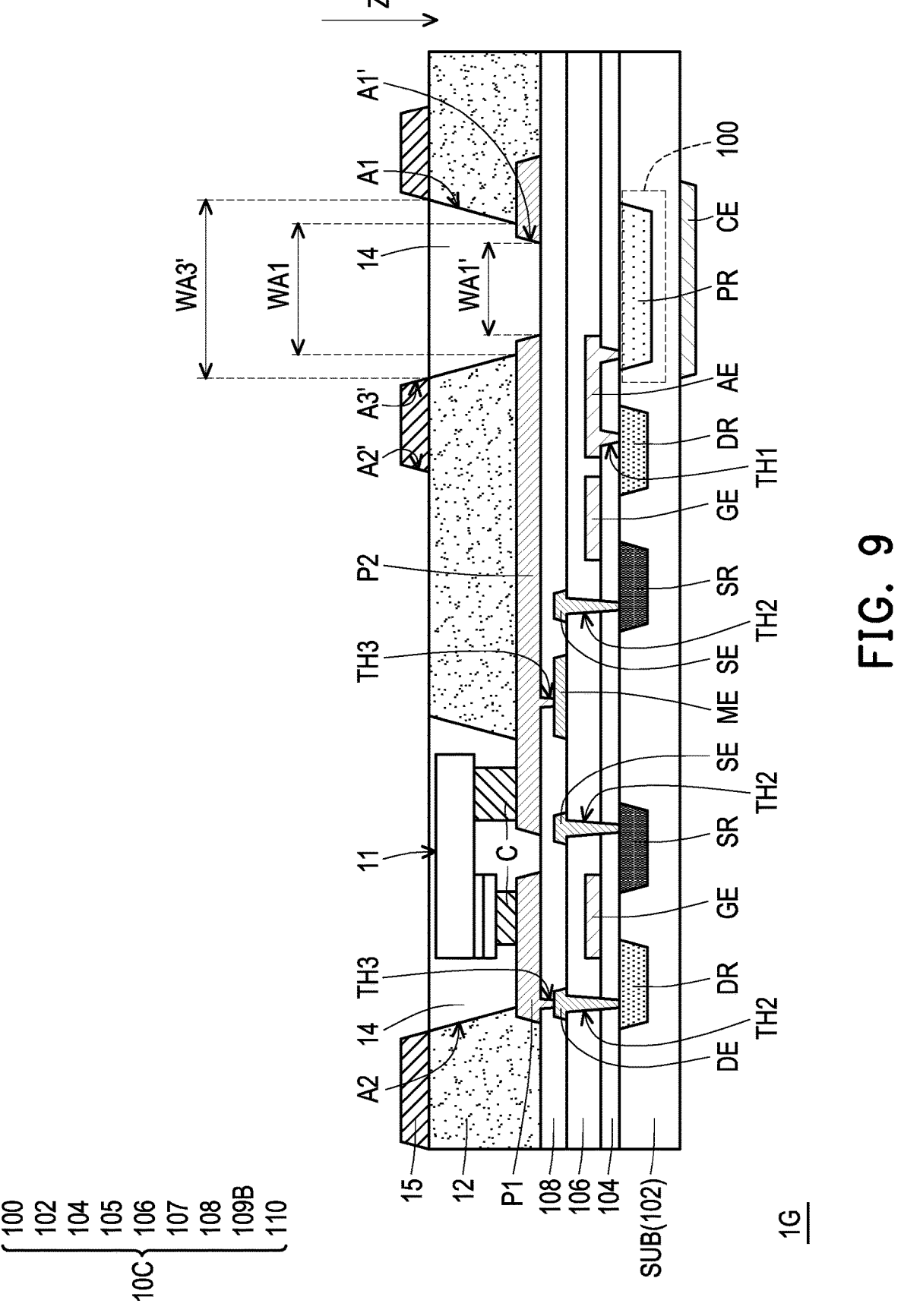

Referring to FIG. 9, the main differences between the electronic device 1G and the electronic device 1C of FIG. 4 are described as follows. The electronic device 1G further includes the opaque layer 12, the light-transmitting layer 14 fill the first opening A1 and the second opening A2, and the metal mesh layer 15 is disposed on the opaque layer 12, wherein the second opening A2' of the metal mesh layer 15 exposes the second opening A2 of the opaque layer 12. Moreover, the first opening A1 of the opaque layer 12 exposes the first opening A1' of the pad P2, and the third opening A3' of the metal mesh layer 15 exposes the first opening A1 of the opaque layer 12. In some embodiments, the bottom width WA1' of the first opening A1' may be made smaller than a bottom width WA1 of the first opening A1, and the bottom width WA1 of the first opening A1 may be made smaller than the bottom width WA3' of the third opening A3', so as to improve the effect of filtering stray light, but the disclosure is not limited thereto.

It should be understood that the electronic device of any embodiment of the disclosure may be designed to filter stray light by using the design of opening in the multi-layer metal layers (e.g. the conductive layer 109B and the metal mesh layer 15) disposed above the optical sensor 100 and the opaque layer 12 light, which will not be repeated below.

Figure 10:
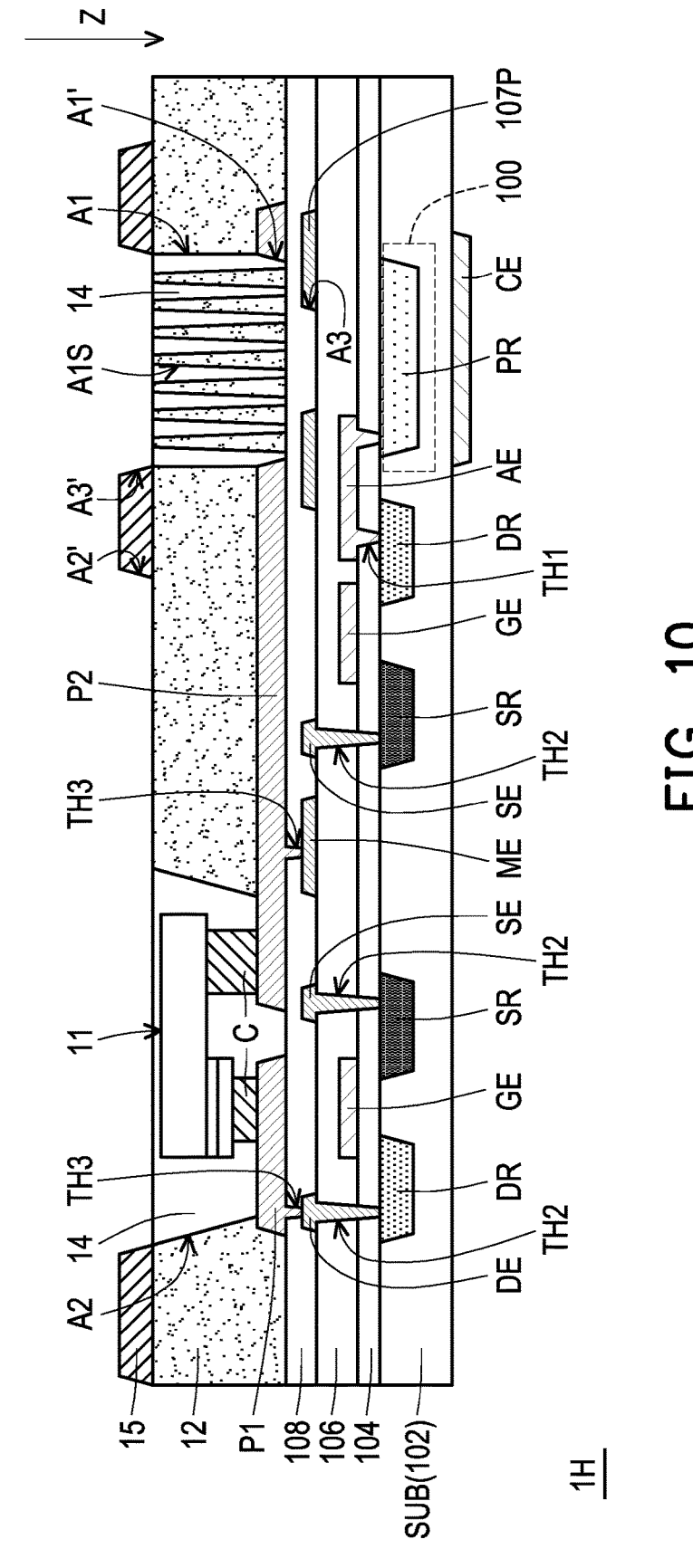

Referring to FIG. 10, the main differences between an electronic device 1H and the electronic device 1G of FIG. 9 are described as follows. In the electronic device 1H, the conductive layer 107 of FIG. 9 is replaced by the conductive layer 107B. Moreover, the first opening A1 includes a plurality of sub-openings A1S, and the light-transmitting layer 14 further fills the plurality of sub-openings A1S.

Using the design of opening in the multi-layer metal layers (such as the conductive layer 107B, the conductive layer 109B and the metal mesh layer 15) disposed above the optical sensor 100, the design of opening in the opaque layer 12, and the design of the plurality of sub-openings A1S, the effect of filtering stray light can be improved.

In other embodiments, although not shown, the design of the plurality of sub-openings A1S may be omitted or the pattern 107P may be omitted. In addition, it should be understood that the electronic device of any embodiment of the disclosure may be designed to filter stray light by using the design of opening in the multi-layer metal layers (such as the conductive layer 107B, the conductive layer 109B and the metal mesh layer 15) disposed above the optical sensor 100 together with design of the plurality of sub-openings A1S of the opaque layer 12, which will not be repeated below.

Figure 11:
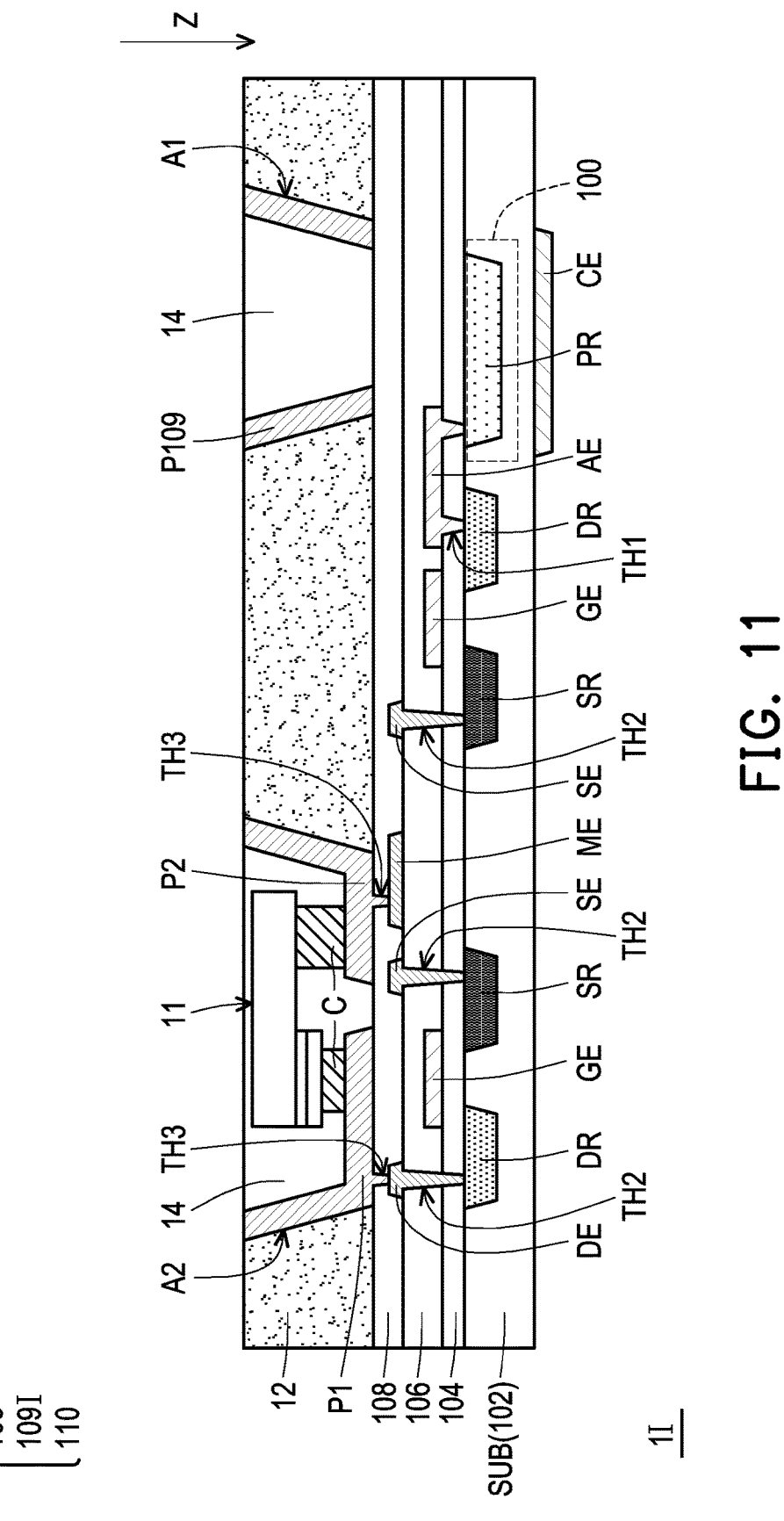

Referring to FIG. 11, the main differences between an electronic device 1I and the electronic device 1 of FIG. 1 are described as follows. In the electronic device 1I, a conductive layer 109I of a circuit substrate 10I is not covered by the opaque layer 12. The conductive layer 109I may include the pad P1, the pad P2, a pattern P109, and other circuits (not shown), but the disclosure is not limited thereto. The pad P1 and the pad P2 are disposed in the second opening A2 of the opaque layer 12 and disposed on the bottom and sidewalls of the second opening A2. The pattern P109 is disposed in the first opening A1 of the opaque layer 12 and disposed on the sidewall of the first opening A1, and the pattern P109 exposes the bottom of the first opening A1.

The metal pad (such as the pad P1 and the pad P2) disposed on the sidewalls of the second opening A2 may be used not only as a barrier wall, but also can improve the light utilization rate, such that the light intensity of the light incident on the object to be measured is increased. In addition, the metal pattern (e.g. the pattern P109) disposed on the sidewall of the first opening A1 can improve the light-receiving effect, such that the light intensity of the light incident on the optical sensor 100 is improved.

It should be understood that the electronic device of any embodiment of the disclosure may be modified as described above, which will not be repeated below.

Figure 12:
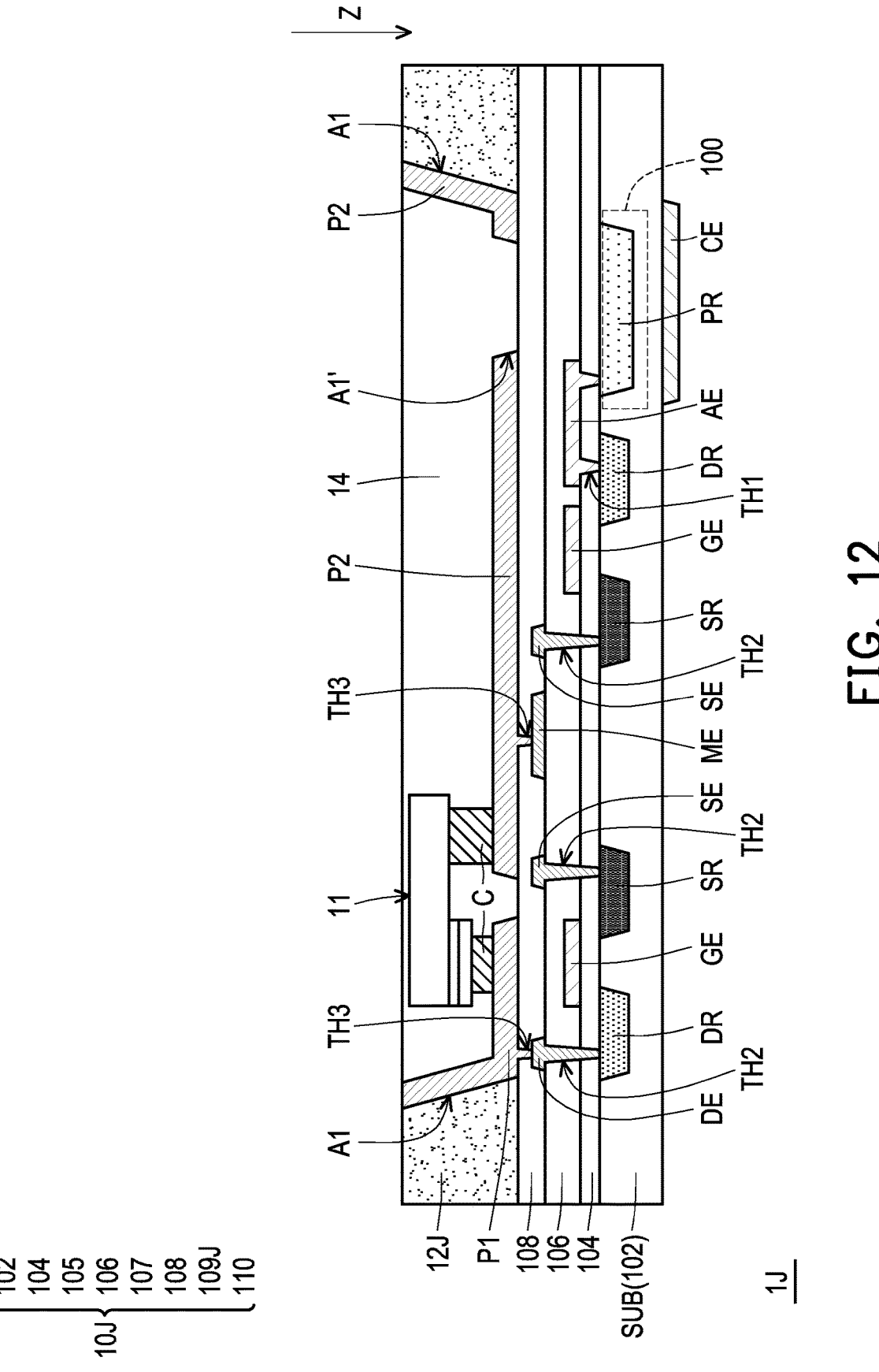

Referring to FIG. 12, the main differences between an electronic device 1J and the electronic device 1I of FIG. 11 are described as follows. In the electronic device 1J, an opaque layer 12J does not include the second opening A2 of FIG. 11, and the inorganic light emitting unit 11 and a conductive layer 109J of a circuit substrate 10J are located in the first opening A1 of the opaque layer 12J. The conductive layer 109J may include the pad P1, the pad P2, and other circuits (not shown), but the disclosure not limited thereto. The pad P1 and the pad P2 are disposed on the bottom and sidewalls of the first opening A1, and the first opening A1' of the pad P2 is disposed corresponding to the optical sensor 100; for example, the first opening A1' overlaps the optical sensor 100 in the direction Z.

The metal pad (such as the pad P1 and the pad P2) disposed on the sidewall of the first opening A1 may be used not only as a retaining wall, but also can improve the light utilization rate or the light receiving effect.

It should be understood that the electronic device of any embodiment of the disclosure may be modified as described above, which will not be repeated below.

Figure 13:
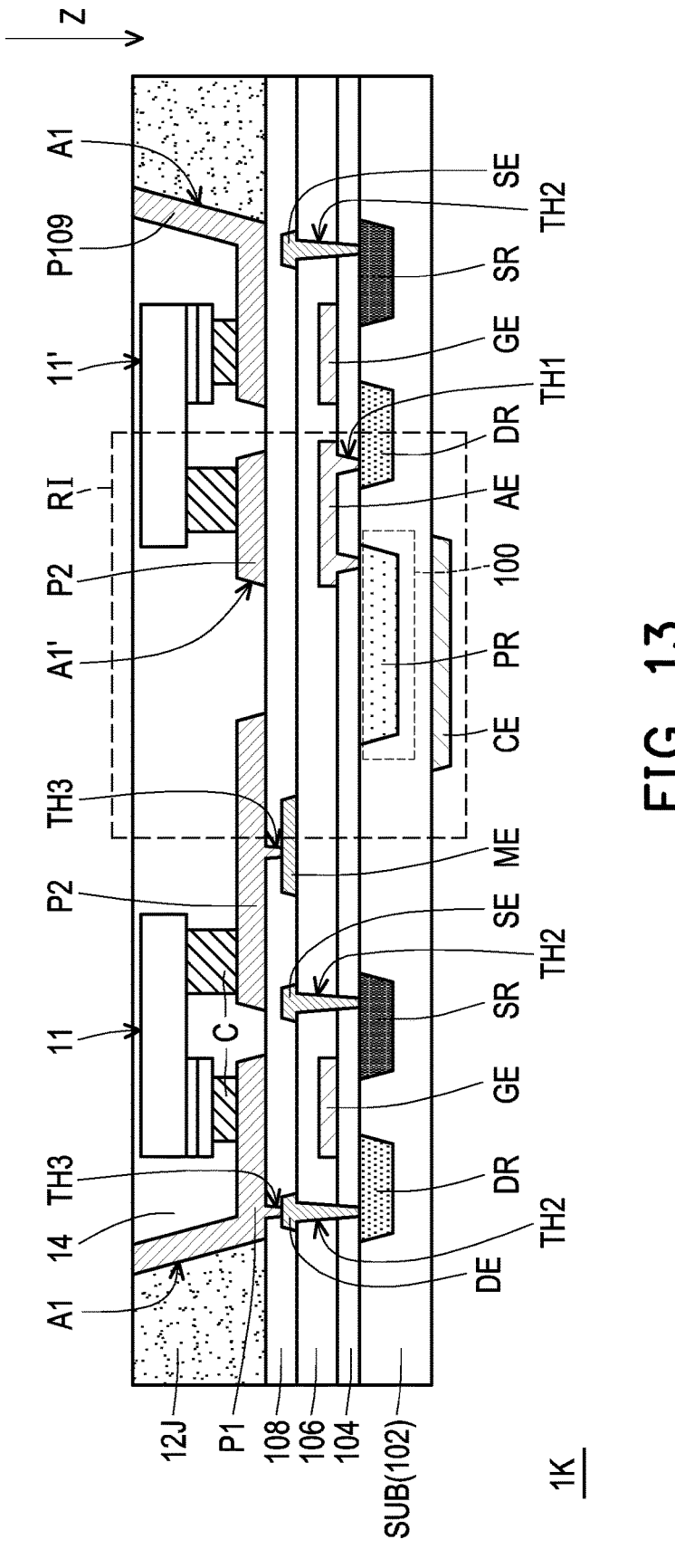
Figure 14:
FIG. 14 is a partial top schematic view of the electronic device in FIG. 13; for a section line I-I' in FIG. 14, refer to a region RI in FIG. 13.
Figure 14:
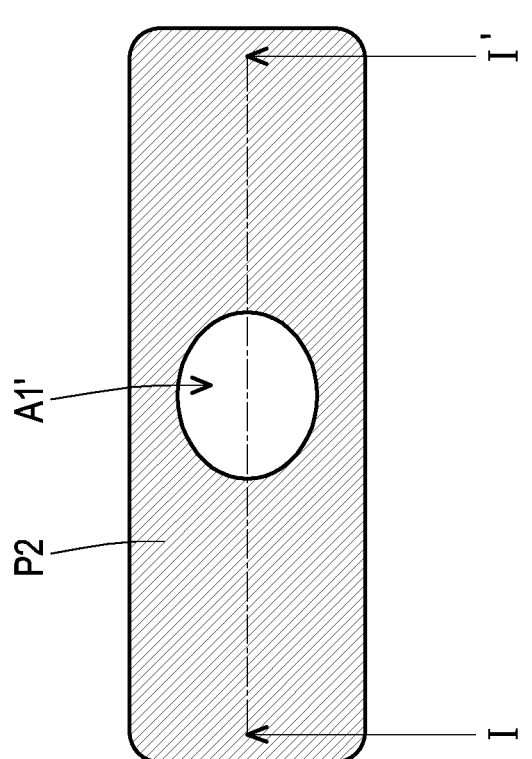

Referring to FIGS. 13 and 14, the main differences between an electronic device 1K and the electronic device 1J of FIG. 12 are described as follows. In a circuit substrate 10K of the electronic device 1K, a conductive layer 109K may include the pad P1, the pad P2, the pattern P109, and other circuits (not shown), but the disclosure is not limited thereto. The pad P1, the pad P2, and the pattern P109 are disposed on the bottom of the first opening A1, and the pad P1 and the pattern P109 are further disposed on the sidewalls of the first openings A1. The right half of the pad P2 and the pattern P109 may be used as a repair pad; when the inorganic light emitting unit 11 cannot operate, another inorganic light emitting unit 11' may be bonded to the right half of the pad P2 and the pattern P109.

It should be understood that the electronic device of any embodiment of the disclosure may be modified as described above, which will not be repeated below.

Figure 15:
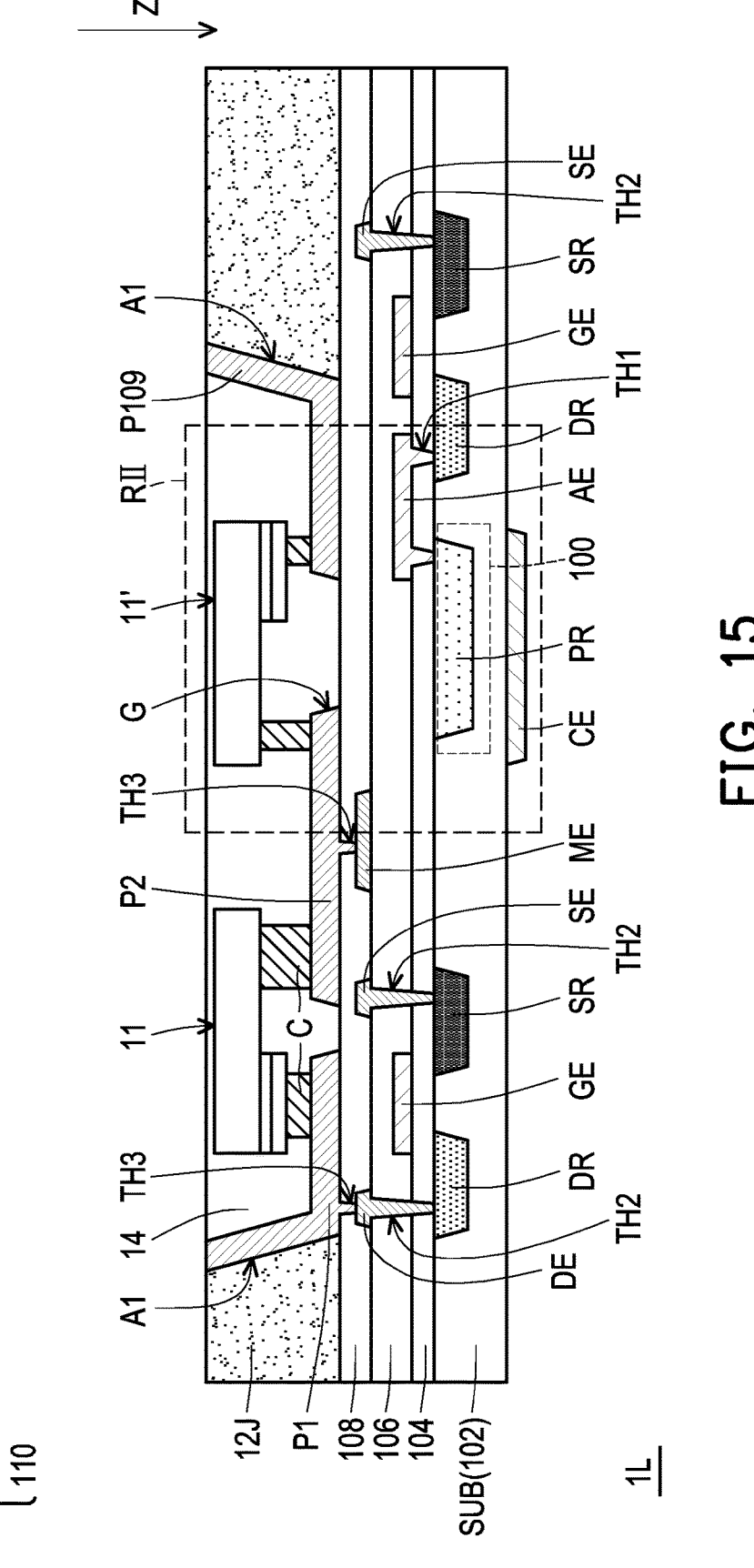
Figure 16:
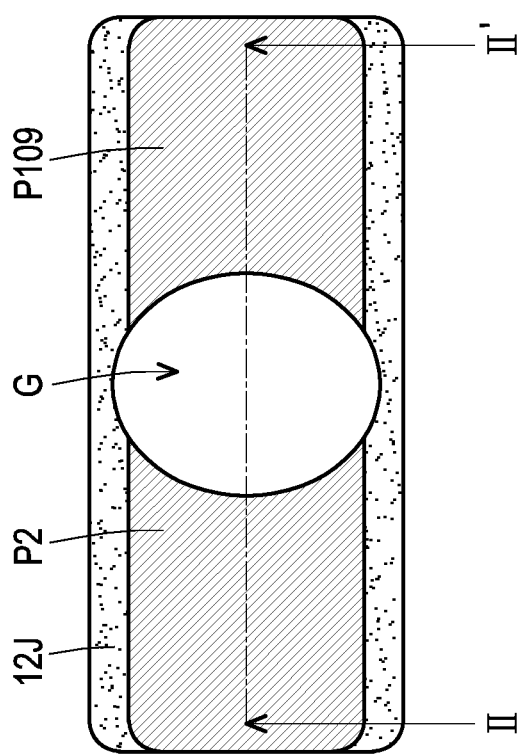
FIG. 16 is a partial top schematic view of the electronic device in FIG. 15; for a section line II-II' in FIG. 16, refer to a region RII in FIG. 15.

Referring to FIGS. 15 and 16, the main differences between an electronic device 1L and the electronic device 1K of FIG. 13 are described as follows. In a circuit substrate 10L of the electronic device 1L, the pad P2 does not include the first opening A1' in FIG. 14, and the gap G between the pad P2 and the pattern P109 corresponds to the optical sensor 100; for example, the gap G overlaps the optical sensor 100 in the direction Z. The pad P2 and the pattern P109 may be used as repair pads; when the inorganic light emitting unit 11 cannot operate, the another inorganic light emitting unit 11' may be bonded to the pad P2 and the pattern P109. In other words, when the inorganic light emitting unit 11 is not abnormal, part of the light may be transmitted to the optical sensor 100 through the gap G.

It should be understood that the electronic device of any embodiment of the disclosure may be modified as described above, which will not be repeated below.

Figure 17:
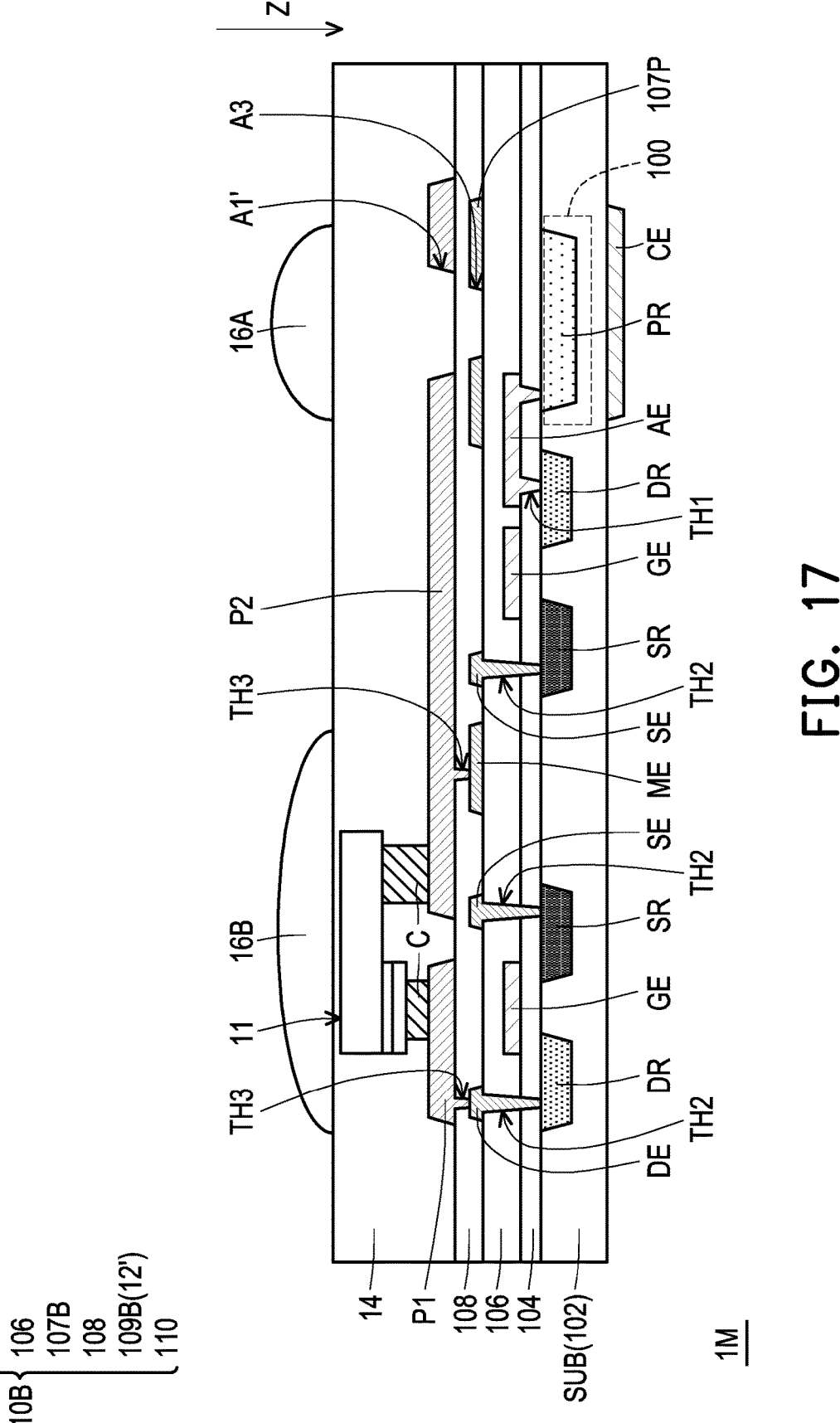

Referring to FIG. 17, the main difference between an electronic device 1M and the electronic device 1B of FIG. 3 is described as follows. The electronic device 1M further includes a lens 16A. In this document, a lens refers to an optical component that may change the traveling direction of a light, such as a convex lens or a concave lens.

The lens 16A is disposed on the optical sensor 100 and overlaps with the first opening A1', so as to guide the light reflected from the object to be measured to the optical sensor 100. In this way, the light receiving effect can be improved, such that the light intensity of the light incident on the optical sensor 100 can be increased. For example, the lens 16A may be a focusing lens, such as a plano-convex lens, but the disclosure is not limited thereto.

In some embodiments, the electronic device 1M may further include a lens 16B. The lens 16B is disposed on the inorganic light emitting unit 11. The lens 16B may be a focusing lens, such as a plano-convex lens, but the disclosure is not limited thereto. According to different requirements, the lens 16B may also be a plano-concave lens, but the disclosure is not limited thereto. The lens 16B may have the same or different dimensions than lens 16A; which is not limited in the disclosure.

It should be understood that the electronic device of any embodiment of the disclosure may further include the lens 16A and/or the lens 16B, which will not be repeated below.

Figure 18:
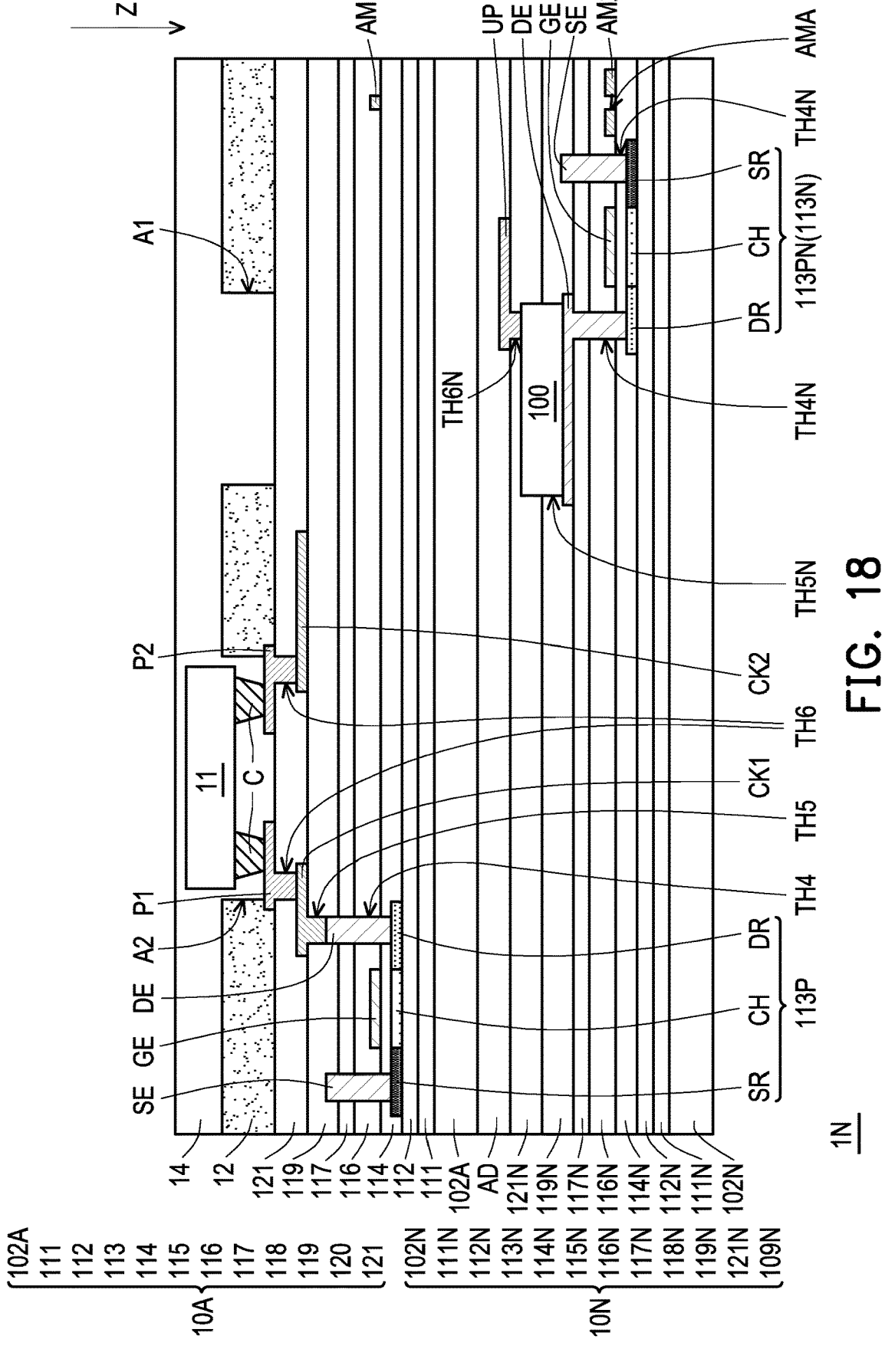

Referring to FIG. 18, the main difference between an electronic device 1N and the electronic device 1B of FIG. 3 is described as follows. In the electronic device 1N, the optical sensor 100 is disposed below the substrate 102A of the circuit substrate 10A. For example, the electronic device 1N may further include a circuit substrate 10N, and the optical sensor 100 and the components or circuits electrically connected thereto are, for example, in the circuit substrate 10N.

In detail, the circuit substrate 10N may include a substrate 102N, a buffer layer 111N, a buffer layer 112N, a semiconductor layer 113N, a dielectric layer 114N, a conductive layer 115N, a dielectric layer 116N, a dielectric layer 117N, a conductive layer 118N, a dielectric layer 119N, a dielectric layer 121N and a conductive layer 109N, but the disclosure is not limited thereto. According to different requirements, the circuit substrate 10N may be added or subtracted with one or more components or layers.

For the material of the substrate 102N, the buffer layer 111N, the buffer layer 112N, the semiconductor layer 113N, the dielectric layer 114N, the conductive layer 115N, the dielectric layer 116N, the dielectric layer 117N, the conductive layer 118N, the dielectric layer 119N, the dielectric layer 121N and the conductive layer 109N, refer to the substrate 102A, the buffer layer 111, the buffer layer 112, the semiconductor layer 113, the dielectric layer 114, the conductive layer 115, the dielectric layer 116, the dielectric layer 117, the conductive layer 118, the dielectric layer 119, the dielectric layer 121, and the conductive layer 109A, which will not be repeated below.

The buffer layer 111N and the buffer layer 112N are sequentially disposed on the substrate 102N. The semiconductor layer 113N is disposed on the buffer layer 112N. The semiconductor layer 113N is, for example, a patterned semiconductor layer and may include a plurality of semiconductor patterns 113PN (only one is schematically shown). The semiconductor pattern 113PN may include the channel region CH, the source region SR, and the drain region DR, wherein the channel region CH is located between the source region SR and the drain region DR. The dielectric layer 114N is disposed on the dielectric layer 112N and covers the semiconductor layer 113N. The conductive layer 115N is disposed on the dielectric layer 114N. The conductive layer 115N may be a patterned conductive layer, and the conductive layer 115N may include the gate electrode GE and other circuits (not shown), but the disclosure is not limited thereto. The gate electrode GE is disposed above the channel region CH, and the gate electrode GE overlaps the channel region CH in the direction Z. The dielectric layer 116N and the dielectric layer 117N are sequentially disposed on the dielectric layer 112N and cover the conductive layer 115N. The conductive layer 118N is disposed on the dielectric layer 117N. The conductive layer 118N may be a patterned conductive layer, and the conductive layer 118N may include the source electrode SE, the drain electrode DE and other circuits (not shown), but the disclosure is not limited thereto. The source electrode SE may be electrically connected to the corresponding source region SR through a through hole TH4N penetrating the dielectric layer 117N, the dielectric layer 116N and the dielectric layer 114N. The drain electrode DE may be electrically connected to the corresponding drain region DR through the corresponding through hole TH4N. The dielectric layer 119N is disposed on the dielectric layer 117N and covers the conductive layer 118N. The optical sensor 100 is disposed in a through hole THSN penetrating the dielectric layer 119N and is electrically connected to the drain electrode DE. The dielectric layer 121N is disposed on the dielectric layer 119N and covers the optical sensor 100. The conductive layer 109N is disposed on the dielectric layer 121N. The conductive layer 109N may be a patterned conductive layer, and the conductive layer 109N may include the electrode UP and other circuits (not shown), but the disclosure is not limited thereto. The electrode UP may be electrically connected to the optical sensor 100 through a corresponding through hole TH6N.

The electronic device IN may further include a bonding layer AD, and the dielectric layer 121N and the substrate 102A may be bonded together through the bonding layer AD. The material of the bonding layer AD may include optical clear adhesive (OCA) or optical clear resin (OCR), but the disclosure is not limited thereto.

In some embodiments, the conductive layer 115 and the conductive layer 115N may be provided with alignment marks to facilitate bonding. For example, the conductive layer 115 may further include an alignment mark AM1, and the conductive layer 115N may further include an alignment mark AM2, wherein the alignment mark AM1 and the alignment mark AM2 are complementary patterns. For example, the alignment mark AM1 may have a cross shape in a top view, and the alignment mark AM2 may have a cross-shaped groove AMA in a top view.

To sum up, in the embodiments of the disclosure, by incorporating the optical sensor in the circuit substrate and forming the first opening for light to pass through in the opaque layer, there is no need to additionally fabricate an optical structure corresponding to the optical sensor, and thus a relatively simplified manufacturing process can be achieved.

The above embodiments are only used to illustrate the technical solutions of the disclosure, but not to limit them; although the disclosure has been described in detail with reference to the foregoing embodiments, those skilled in the art should understand that the technical solutions described in the foregoing embodiments can still be modified, or some or all of the technical features thereof can be equivalently replaced, and these modifications or substitutions do not make the essence of the corresponding technical solutions deviate from the scope of the technical solutions of the embodiments of the disclosure.

Although the embodiments of the disclosure and their advantages have been disclosed as above, it should be understood that any person having ordinary knowledge in the technical field can make changes, substitutions and modifications without departing from the spirit and scope of the disclosure, and the features of each embodiment can be arbitrarily mixed and replaced with each other to form other new embodiments. In addition, the protection scope of the disclosure is not limited to the process, machine, manufacture, material composition, device, method and steps in the specific embodiments described in the specification; anyone with ordinary knowledge in the art can understand the present or future developed processes, machines, manufactures, compositions, devices, methods and steps from the disclosure, and anything that can perform substantially the same functions or achieve substantially the same results in the embodiments described herein can be used in accordance with the disclosure.

Therefore, the protection scope of the disclosure includes the above-mentioned processes, machines, manufactures, material compositions, devices, methods and steps. In addition, each claim constitutes a separate embodiment, and the scope of the disclosure also includes combinations of each claim and the embodiment. The scope of protection of the disclosure shall be defined by the appended claims.

What is claimed is:

1. An electronic device, comprising:
    a circuit substrate comprising an optical sensor;

an inorganic light emitting unit disposed on the circuit substrate and configured to emit a light; and an opaque layer disposed on the circuit substrate, comprising a first opening through which a portion of the light is transmitted to the optical sensor, wherein the first opening comprises a plurality of sub-openings.

2. The electronic device according to claim 1, wherein a transmittance of the opaque layer with respect to the light is less than 50%.

3. The electronic device according to claim 1, wherein the opaque layer comprises a second opening in which the inorganic light emitting unit is disposed.

4. The electronic device according to claim 1, further comprising:

a lens disposed on the optical sensor and overlapped with the first opening.

5. The electronic device according to claim 1, wherein the circuit substrate comprises a substrate and the optical sensor is disposed on the substrate.

6. The electronic device according to claim 1, wherein the circuit substrate comprises a substrate and the optical sensor is disposed under the substrate.

7. The electronic device according to claim 1, wherein the circuit substrate comprises a semiconductor substrate and the optical sensor is embedded in the semiconductor substrate.

8. The electronic device according to claim 1, wherein the inorganic light emitting unit is an LED chip.

9. The electronic device according to claim 1, wherein the optical sensor is configured to sense a fingerprint.

10. An electronic device, comprising:

a circuit substrate comprising an optical sensor;

an inorganic light emitting unit disposed on the circuit substrate and configured to emit a light; and an opaque layer disposed on the circuit substrate, comprising a first opening through which a portion of the light is transmitted to the optical sensor, wherein the opaque layer comprises a metal pad on which the inorganic light emitting unit is bonded.

11. An electronic device, comprising:

a circuit substrate comprising an optical sensor;

an inorganic light emitting unit disposed on the circuit substrate and configured to emit a light;

an opaque layer disposed on the circuit substrate, comprising a first opening through which a portion of the light is transmitted to the optical sensor; and a metal mesh layer disposed on the inorganic light emitting unit, wherein the metal mesh layer comprises a third opening overlapped with the first opening.

* * * * *